US009397107B2

(12) United States Patent
Makala et al.

(10) Patent No.: US 9,397,107 B2
(45) Date of Patent: Jul. 19, 2016

(54) METHODS OF MAKING THREE DIMENSIONAL NAND DEVICES

(71) Applicant: SanDisk Technologies, Inc., Plano, TX (US)

(72) Inventors: Raghuveer S. Makala, Campbell, CA (US); Yao-Sheng Lee, Tampa, FL (US); Senaka Krishna Kanakamedala, Milpitas, CA (US); Yanli Zhang, San Jose, CA (US); George Matamis, Danville, CA (US); Johann Alsmeier, San Jose, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 47 days.

(21) Appl. No.: 14/319,591

(22) Filed: Jun. 30, 2014

(65) Prior Publication Data
US 2015/0380424 A1 Dec. 31, 2015

(51) Int. Cl.
*H01L 27/115* (2006.01)
*H01L 29/49* (2006.01)
(Continued)

(52) U.S. Cl.
CPC ...... *H01L 27/11556* (2013.01); *H01L 21/0217* (2013.01); *H01L 21/02123* (2013.01); *H01L 21/02164* (2013.01); *H01L 21/02186* (2013.01); (Continued)

(58) Field of Classification Search
CPC .................. H01L 2924/0002; H01L 27/11582; H01L 2924/00; H01L 27/11556; H01L 27/11578; H01L 27/0688
USPC .................................... 257/2, 5, 314, E21.209
See application file for complete search history.

(56) References Cited

U.S. PATENT DOCUMENTS 5,084,417 A 1/1992 Joshi et al.
5,807,788 A 9/1998 Brodsky et al.
(Continued)

FOREIGN PATENT DOCUMENTS

WO WO02/15277 A2 2/2002
WO WO2014066792 A1 5/2013
WO 2014066792 A1 5/2014

OTHER PUBLICATIONS

International Searching Report and Written Opinion for PCT/US2015/035961, dated Nov. 19, 2015, 17 pages.
(Continued)

*Primary Examiner* — David Vu
*Assistant Examiner* — Jonathan Han
(74) *Attorney, Agent, or Firm* — The Marbury Law Group PLLC

(57) ABSTRACT

A method of making a three dimensional NAND string includes providing a stack of alternating first material layers and second material layers over a substrate. The method further includes forming a front side opening in the stack, forming a tunnel dielectric in the front side opening, forming a semiconductor channel in the front side opening over the tunnel dielectric and forming a back side opening in the stack. The method also includes selectively removing the second material layers through the back side opening to form back side recesses between adjacent first material layers, forming a metal charge storage layer in the back side opening and in the back side recesses and forming discrete charge storage regions in the back side recesses by removing the metal charge storage layer from the back side opening and selectively recessing the metal charge storage layer in the back side recesses.

17 Claims, 7 Drawing Sheets

(51) Int. Cl.

| | |
|---|---|
| *H01L 29/51* | (2006.01) |
| *H01L 21/28* | (2006.01) |
| *H01L 21/285* | (2006.01) |
| *H01L 21/02* | (2006.01) |
| *H01L 29/423* | (2006.01) |

(52) U.S. Cl.
CPC .... *H01L 21/28273* (2013.01); *H01L 21/28556* (2013.01); *H01L 21/28568* (2013.01); *H01L 27/11519* (2013.01); *H01L 27/11524* (2013.01); *H01L 27/11526* (2013.01); *H01L 29/42324* (2013.01); *H01L 29/495* (2013.01); *H01L 29/511* (2013.01); *H01L 29/518* (2013.01)

(56) References Cited

U.S. PATENT DOCUMENTS

| | | | |
|---|---|---|---|
| 5,915,167 | A | 6/1999 | Leedy |
| 7,177,191 | B2 | 2/2007 | Fasoli et al. |
| 7,221,588 | B2 | 5/2007 | Fasoli et al. |
| 7,233,522 | B2 | 6/2007 | Chen et al. |
| 7,378,353 | B2 | 5/2008 | Lee et al. |
| 7,514,321 | B2 | 4/2009 | Mokhlesi et al. |
| 7,575,973 | B2 | 8/2009 | Mokhlesi et al. |
| 7,608,195 | B2 | 10/2009 | Wilson |
| 7,648,872 | B2 | 1/2010 | Benson |
| 7,745,265 | B2 | 6/2010 | Mokhlesi et al. |
| 7,745,312 | B2 | 6/2010 | Herner et al. |
| 7,808,038 | B2 | 10/2010 | Mokhlesi et al. |
| 7,848,145 | B2 | 12/2010 | Mokhlesi et al. |
| 7,851,851 | B2 | 12/2010 | Mokhlesi et al. |
| 8,008,710 | B2 | 8/2011 | Fukuzumi |
| 8,053,829 | B2 | 11/2011 | Kang et al. |
| 8,093,725 | B2 | 1/2012 | Wilson |
| 8,187,936 | B2 | 5/2012 | Alsmeier et al. |
| 8,193,054 | B2 | 6/2012 | Alsmeier |
| 8,198,672 | B2 | 6/2012 | Alsmeier |
| 8,283,228 | B2 | 10/2012 | Alsmeier |
| 8,349,681 | B2 | 1/2013 | Alsmeier et al. |
| 2006/0102586 | A1 | 5/2006 | Lee et al. |
| 2007/0210338 | A1 | 9/2007 | Orlowski |
| 2007/0252201 | A1 | 11/2007 | Kito et al. |
| 2010/0044778 | A1 | 2/2010 | Seol |
| 2010/0112769 | A1 | 5/2010 | Son et al. |
| 2010/0120214 | A1* | 5/2010 | Park ............... H01L 27/11578 438/287 |
| 2010/0155810 | A1 | 6/2010 | Kim et al. |
| 2010/0155818 | A1 | 6/2010 | Cho |
| 2010/0181610 | A1 | 7/2010 | Kim et al. |
| 2010/0207195 | A1 | 8/2010 | Fukuzumi et al. |
| 2010/0320528 | A1 | 12/2010 | Jeong et al. |
| 2011/0076819 | A1 | 3/2011 | Kim et al. |
| 2011/0133606 | A1 | 6/2011 | Yoshida et al. |
| 2011/0266606 | A1 | 11/2011 | Park et al. |
| 2011/0294290 | A1 | 12/2011 | Nakanishi et al. |
| 2012/0001247 | A1 | 1/2012 | Alsmeier |
| 2012/0001249 | A1 | 1/2012 | Alsmeier |
| 2012/0256247 | A1* | 10/2012 | Alsmeier ............. H01L 21/764 257/319 |
| 2013/0056820 | A1* | 3/2013 | Jeong ................. H01L 27/0688 257/324 |
| 2013/0122712 | A1 | 5/2013 | Kim et al. |
| 2013/0224960 | A1 | 8/2013 | Payyapilly et al. |
| 2013/0248974 | A1 | 9/2013 | Alsmeier et al. |
| 2013/0264631 | A1 | 10/2013 | Alsmeier et al. |
| 2013/0313627 | A1 | 11/2013 | Lee et al. |
| 2014/0008714 | A1 | 1/2014 | Makala et al. |

OTHER PUBLICATIONS

PCT No. PCT/US2015/035961: Filed Jun. 16, 2015: Invitation to pay fees with partial search report, Dated Sep. 9, 2015.
Jang et al., "Vertical Cell Array Using TCAT (Terabit Cell Array Transistor) Technology for Ultra High Density NAND Flash Memory," 2009 Symposium on VLSI Technology Digest of Technical Papers, pp. 192-193.
Katsumata et al., "Pipe-Shaped BiCS Flash Memory with 16 Stacked Layers and Multi-Level-Cell Operation for Ultra High Density Storage Devices," 2009 Symposium on VLSI Technology Digest of Technical Papers, pp. 136-137.
Maeda et al., "Multi-Stacked 1G Cell/Layer Pipe-Shaped BiCS Flash Memory," 2009 Symposium on VLSI Technology Digest of Technical Papers, pp. 22-23.
Endoh et al., "Novel Ultra High Density Memory with a Stacked-Surrounding Gate Transistor (S-SGT) Structured Cell," IEDM Proc. (2001) 33-36.
Tanaka et al., "Bit-Cost Scalable Technology for Low-Cost and Ultrahigh-Density Flash Memory," Toshiba Review, vol. 63, No. 2, 2008, pp. 28-31.
Masahide Kimura, "3D Cells Make Terabit NAND Flash Possible," Nikkei Electronics Asia, Sep. 17, 2009, 6pgs.
International Search Report & Written Opinion, PCT/US2011/042566, Jan. 17, 2012.
Invitation to Pay Additional Fees & Partial International Search Report, PCT/US2011/042566, Sep. 28, 2011.
Jang et al., "Memory Properties of Nickel Silicide Nanocrystal Layer for Possible Application to Nonvolatile Memory Devices," IEEE Transactions on Electron Devices, vol. 56, No. 12, Dec. 2009.
Chen et al., "Reliability Characteristics of NiSi Nanocrystals Embedded in Oxide and Nitride Layers for Nonvolatile Memory Application," Applied Physics Letters 92, 152114 (2008).
J. Ooshita, Toshiba Announces 32Gb 3D-Stacked Multi-Level NAND Flash, 3 pages, http://techon.nikkeibp.co.jp/english/NEWS_EN/20090619/171977/ Nikkei Microdevices, Tech-On, Jun. 19, 2009.
Wang et al., "Low Temperature Silicon Selective Epitaxial Growth (SEG) and Phosphorous Doping in a Reduced-Pressure Pancake Reactor", ECE Technical Reports, Paper 299 (Apr. 1, 1992).
Whang et al., "Novel 3-Dimensional Dual Control-Gate with Surrounding Floating-Gate (DC-SF) NAND Flash Cell for 1Tb File Storage Application", IEDM-2010 Proceedings, Dec. 6-8, 2010, pp. 668-671.
Y.S. Kim et al., "Direct Copper Electroless Deposition on a Tungsten Barrier Layer for Ultralarge Scale Integration," Journal of the Electrochemical Society, vol. 152 (2) 2005.
Y. Au et al., "Filling Narrow Trenches by Iodine-Catalyzed CVD of Copper and Manganese on Manganese Nitride Barrier/Adhesion Layers," Journal of the Electrochemical Society, vol. 158 (5) 2011.
K. R. Williams et al., "Etch Rates for Micromachining Processing," Journal of Microelectromechanical Systems, vol. 5, No. 4, Dec. 1996.
K. R. Williams et al., "Etch Rates for Micromachining Processing Part II," Journal of the Microelectromechanical Systems, vol. 12, No. 6, Dec. 2003.
M. Claes et al., "Selective Wet Etching of Hf-based Layers," Abstracts, 204th Meeting of the Electrochemical Society, 2003.
U.S. Appl. No. 13/762,988, filed Feb. 8, 2013, SanDisk Technologies Inc.
U.S. Appl. No. 14/133,979, filed Dec. 19, 2013, SanDisk Technologies Inc.
U.S. Appl. No. 14/183,152, filed Feb. 18, 2014, SanDisk Technologies Inc.
U.S. Appl. No. 14/219,161, filed Mar. 19, 2014, SanDisk Technologies Inc.
U.S. Appl. No. 14/225,116, filed Mar. 25, 2014, SanDisk Technologies Inc.
U.S. Appl. No. 14/225,176, filed Mar. 25, 2014, SanDisk Technologies Inc.
U.S. Appl. No. 14/264,262, filed Apr. 29, 2014, SanDisk Technologies Inc.
U.S. Appl. No. 14/264,312, filed Apr. 29, 2014, SanDisk Technologies Inc.
U.S. Appl. No. 14/264,407, filed Apr. 29, 2014, SanDisk Technologies Inc.
U.S. Appl. No. 14/282,567, filed May 20, 2014, SanDisk Technologies Inc.

\* cited by examiner

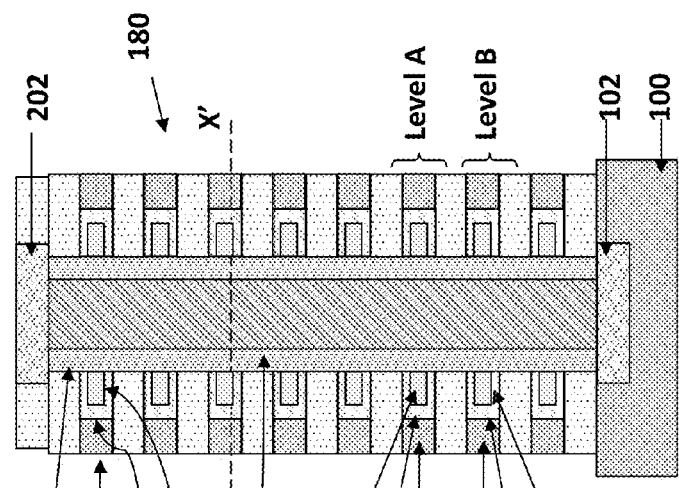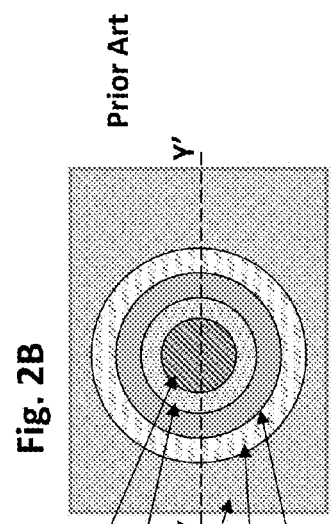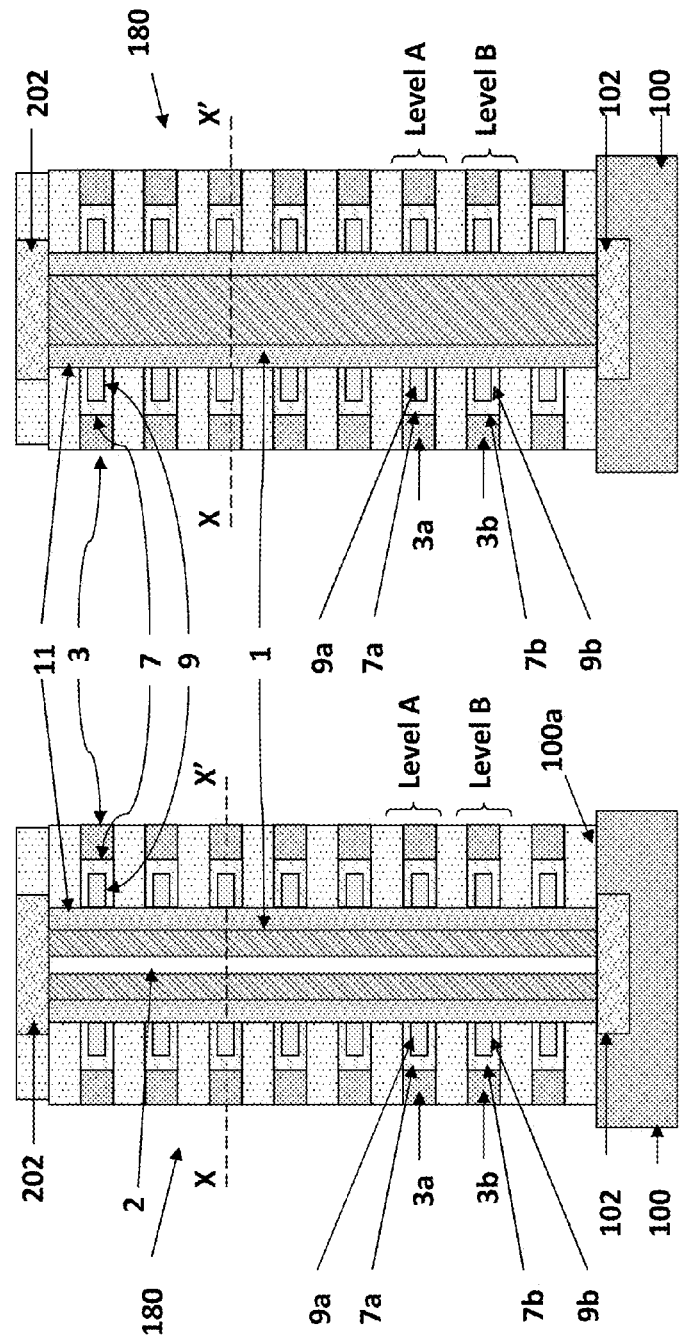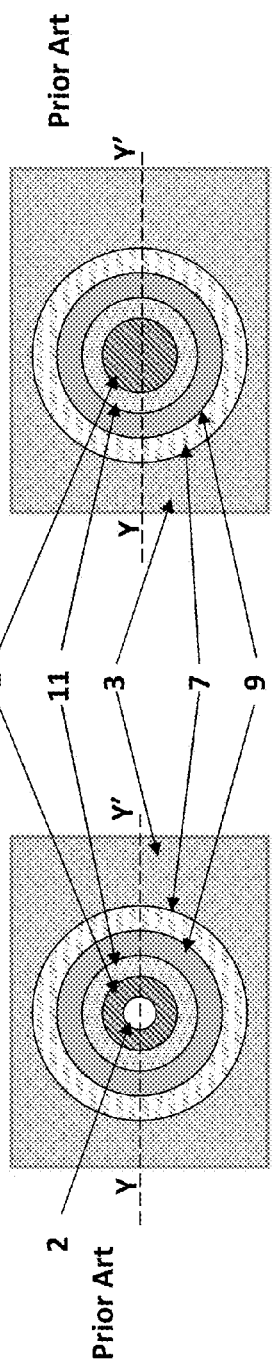

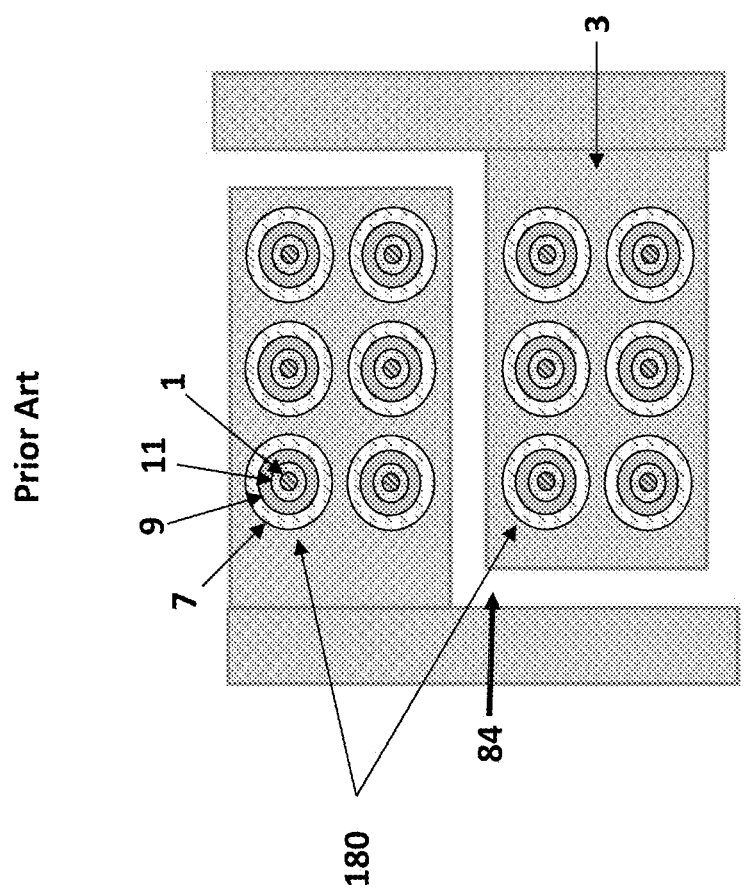

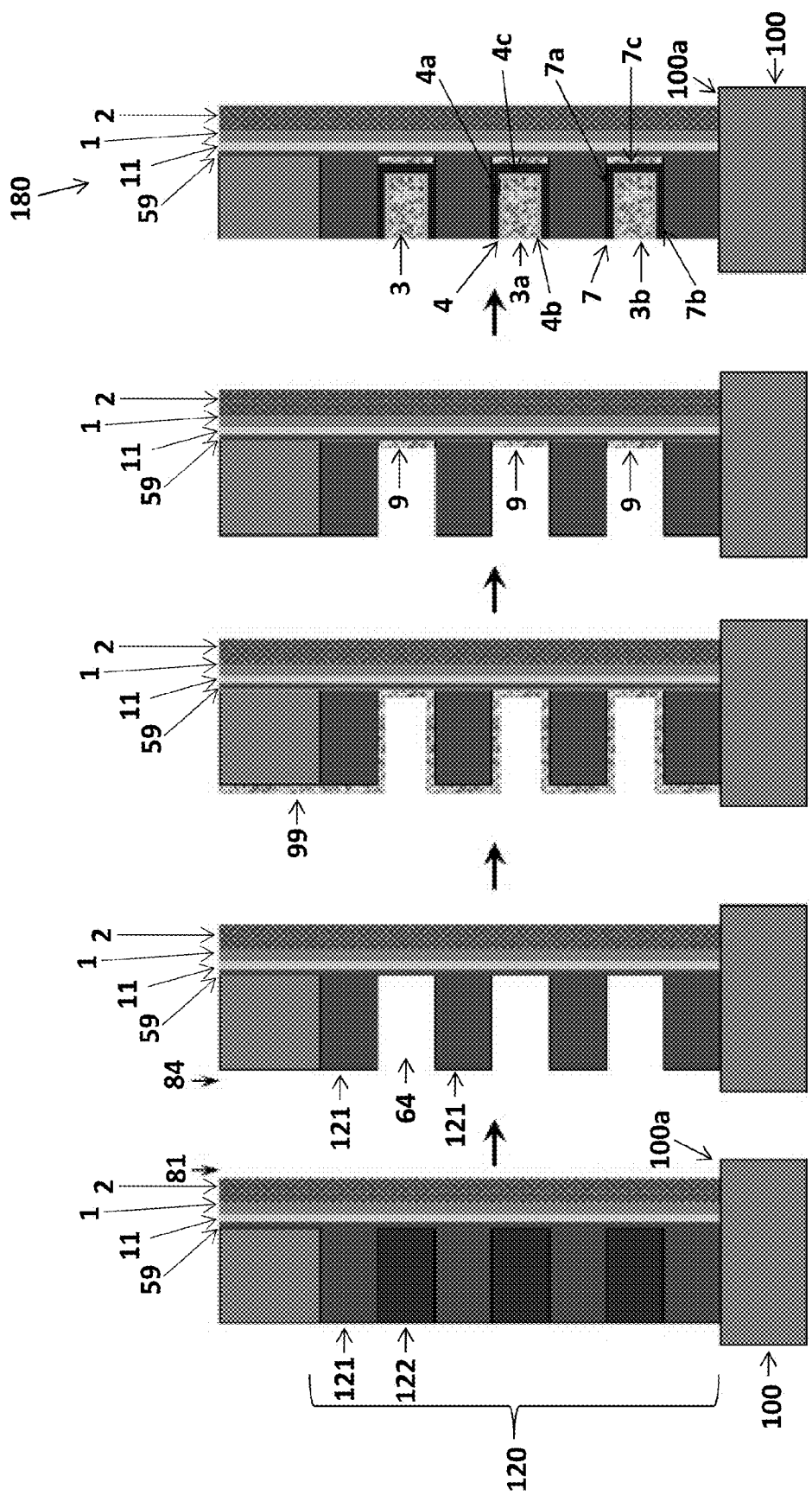

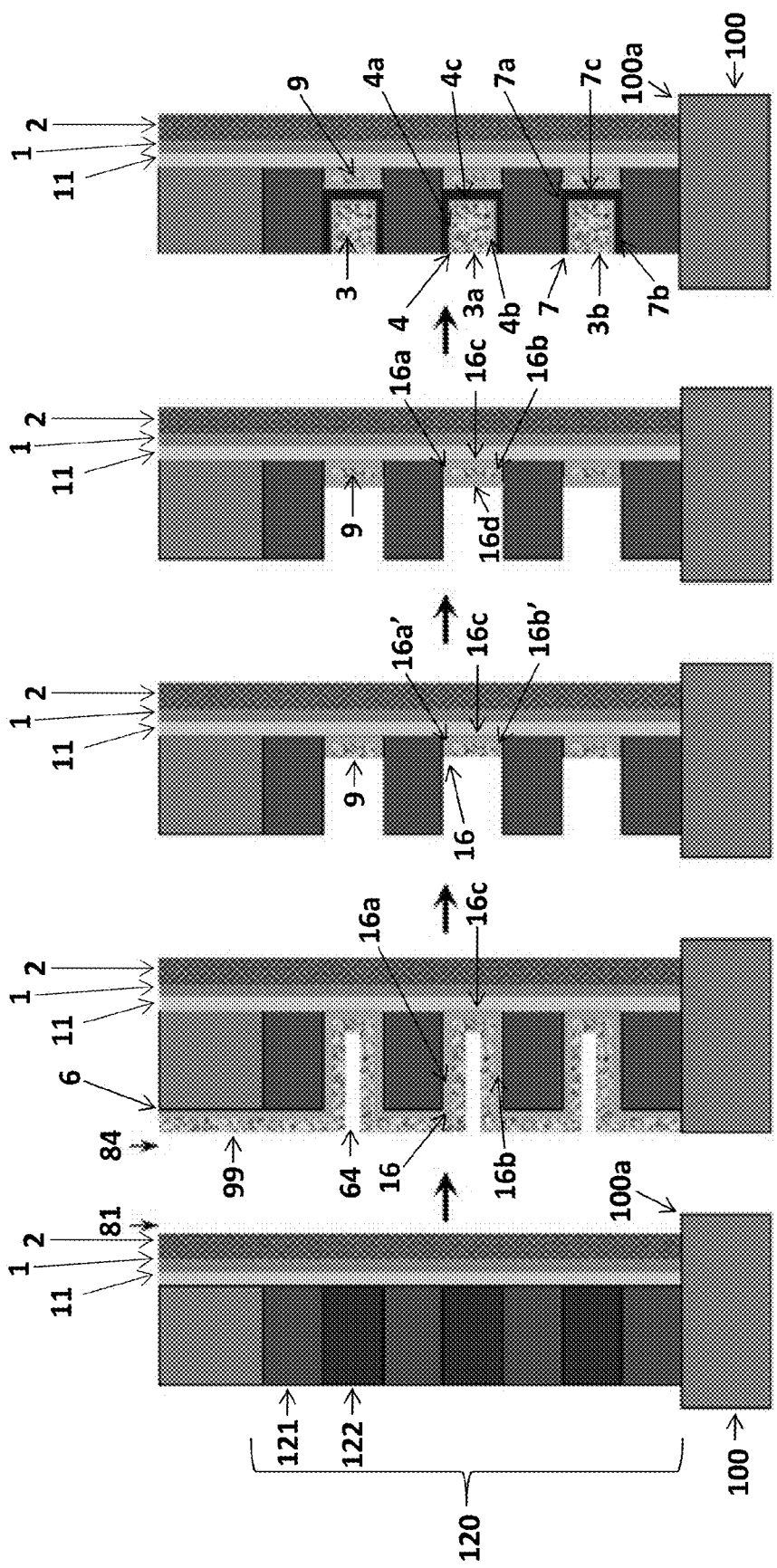

METHODS OF MAKING THREE DIMENSIONAL NAND DEVICES

FIELD

The present invention relates generally to the field of semiconductor devices and specifically to three dimensional vertical NAND strings and other three dimensional devices and methods of making thereof.

BACKGROUND

Three dimensional vertical NAND strings are disclosed in an article by T. Endoh, et. al., titled "Novel Ultra High Density Memory With A Stacked-Surrounding Gate Transistor (S-SGT) Structured Cell", IEDM Proc. (2001) 33-36. However, this NAND string provides only one bit per cell. Furthermore, the active regions of the NAND string is formed by a relatively difficult and time consuming process involving repeated formation of sidewall spacers and etching of a portion of the substrate, which results in a roughly conical active region shape.

SUMMARY

An embodiment relates to a method of making a three dimensional NAND string including providing a stack of alternating first material layers and second material layers over a substrate. The first material layers include an insulating material and the second material layers include sacrificial layers. The method further includes forming a front side opening in the stack, forming a tunnel dielectric in the front side opening, forming a semiconductor channel in the front side opening over the tunnel dielectric and forming a back side opening in the stack. The method also includes selectively removing the second material layers through the back side opening to form back side recesses between adjacent first material layers, forming a metal charge storage layer in the back side opening and in the back side recesses and forming discrete charge storage regions in the back side recesses by removing the metal charge storage layer from the back side opening and selectively recessing the metal charge storage layer in the back side recesses.

Another embodiment relates to a monolithic three dimensional NAND string including a semiconductor channel with at least one end portion of the semiconductor channel extending substantially perpendicular to a major surface of a substrate. The NAND string also includes a plurality of control gate electrodes extending substantially parallel to the major surface of the substrate. The plurality of control gate electrodes include at least a first control gate electrode located in a first device level and a second control gate electrode located in a second device level located over the major surface of the substrate and below the first device level. The NAND string also includes a blocking dielectric located in contact with the plurality of control gate electrodes, a tunnel dielectric in contact with the semiconductor channel and a plurality of vertically spaced apart floating gates located between the blocking dielectric and the tunnel dielectric. Each floating gate includes a tungsten portion located between a first nitride layer and a second nitride layer.

Another embodiment relates to a monolithic, three dimensional array of memory devices located over a silicon substrate including an array of vertically oriented NAND strings in which at least one memory cell in a first device level of the array is located over another memory cell in a second device level and an integrated circuit including a driver circuit for the array of memory devices located on the silicon substrate. At least one vertically oriented NAND string of the array of vertically oriented NAND strings includes: a semiconductor channel, at least one end portion of the semiconductor channel extending substantially perpendicular to a major surface of a substrate and a plurality of control gate electrodes extending substantially parallel to the major surface of the substrate. The plurality of control gate electrodes include at least a first control gate electrode located in the first device level and a second control gate electrode located in the second device level located over the major surface of the substrate and below the first device level. The NAND strings also include a blocking dielectric located in contact with the plurality of control gate electrodes, a tunnel dielectric in contact with the semiconductor channel and a plurality of vertically spaced apart floating gates located between the blocking dielectric and the tunnel dielectric. Each floating gate includes a tungsten portion located between a first nitride layer and a second nitride layer.

BRIEF DESCRIPTION OF THE DRAWINGS

FIGS. 1A and 1B are respectively side cross sectional and top cross sectional views of a conventional NAND string. FIG. 1A is a side cross sectional view of the device along line Y-Y' in FIG. 1B, while FIG. 1B is a side cross sectional view of the device along line X-X' in FIG. 1A.

FIGS. 2A and 2B are respectively side cross sectional and top cross sectional views of another conventional NAND string. FIG. 2A is a side cross sectional view of the device along line Y-Y' in FIG. 2B, while FIG. 2B is a side cross sectional view of the device along line X-X' in FIG. 2A.

FIG. 4 is a top schematic view of a portion of a conventional memory device comprising NAND strings.

FIGS. 6A-6E illustrate a method of making a NAND string according to an embodiment.

FIGS. 7A-7E illustrate a method of making a NAND string according to an embodiment.

DETAILED DESCRIPTION

Many conventional three dimensional NAND memories store charge in silicon nitride charge storage dielectric layers. The conventional devices suffer from slower erase times, less than desirable data retention and charge spreading. The inventors have realized that low work function conducting floating gates provide better performance than charge storage silicon nitride dielectric layers.

The inventors have developed methods that allow for the fabrication of metal (e.g., pure metal, such as tungsten, and/or electrically conductive metal alloy, such as tungsten nitride or titanium nitride) floating gate NAND devices. In an embodiment, a sequential deposition-etch sequence is used for selective formation of floating gates in the recesses in sidewalls of a high-aspect ratio three dimensional NAND structure. An advantage of the methods is that the thermal budget constraints used to fabricate floating gates allows a different order of fabrication steps which does not require an additional high temperature annealing typically used in fabricating the tunnel dielectric and polysilicon channel. The additional high temperature anneal tends to lead to poor tunnel dielectric quality which degrades the device program/erase speed. Further, incomplete crystallization of channel causes low drive currents. In the methods discussed below, the floating gates are formed after annealing the tunnel dielectric and the polysilicon channel. An additional advantage is that the NAND strings may be fabricated by only forming recesses from the back side opening (slit trench) rather than forming recesses from both the back side opening and the front side (memory hole) openings. Furthermore, the back side recesses are typically deeper (e.g. 100-500 nm deep) than the shallow front side recesses (e.g. 3-10 nm deep) which improves the ease of forming the metal floating gates through the high aspect ratio openings.

A monolithic three dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and adhering the memory levels atop each other, as in Leedy, U.S. Pat. No. 5,915,167, titled "Three Dimensional Structure Memory." The substrates may be thinned or removed from the memory levels before bonding, but as the memory levels are initially formed over separate substrates, such memories are not true monolithic three dimensional memory arrays.

Figure 3A:
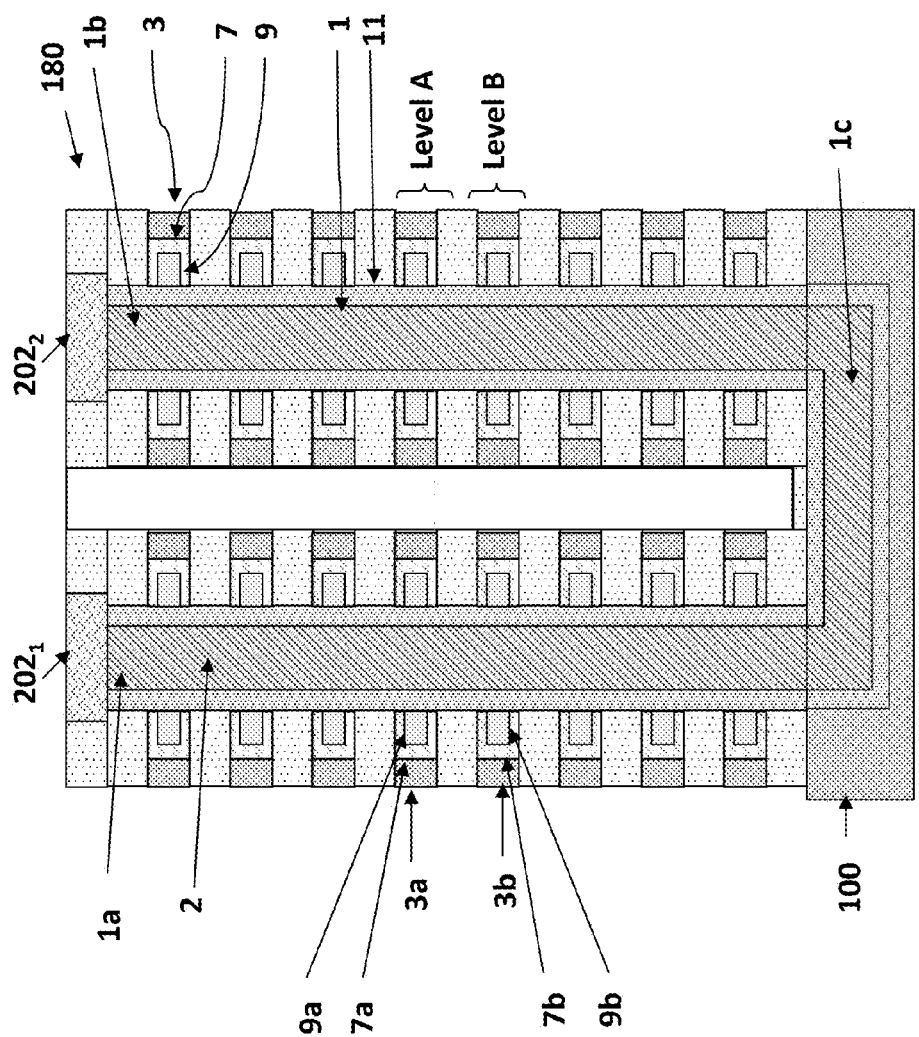
FIG. 3A is a side cross sectional view of a conventional NAND string of an embodiment with a U-shaped channel.
Figure 3B:
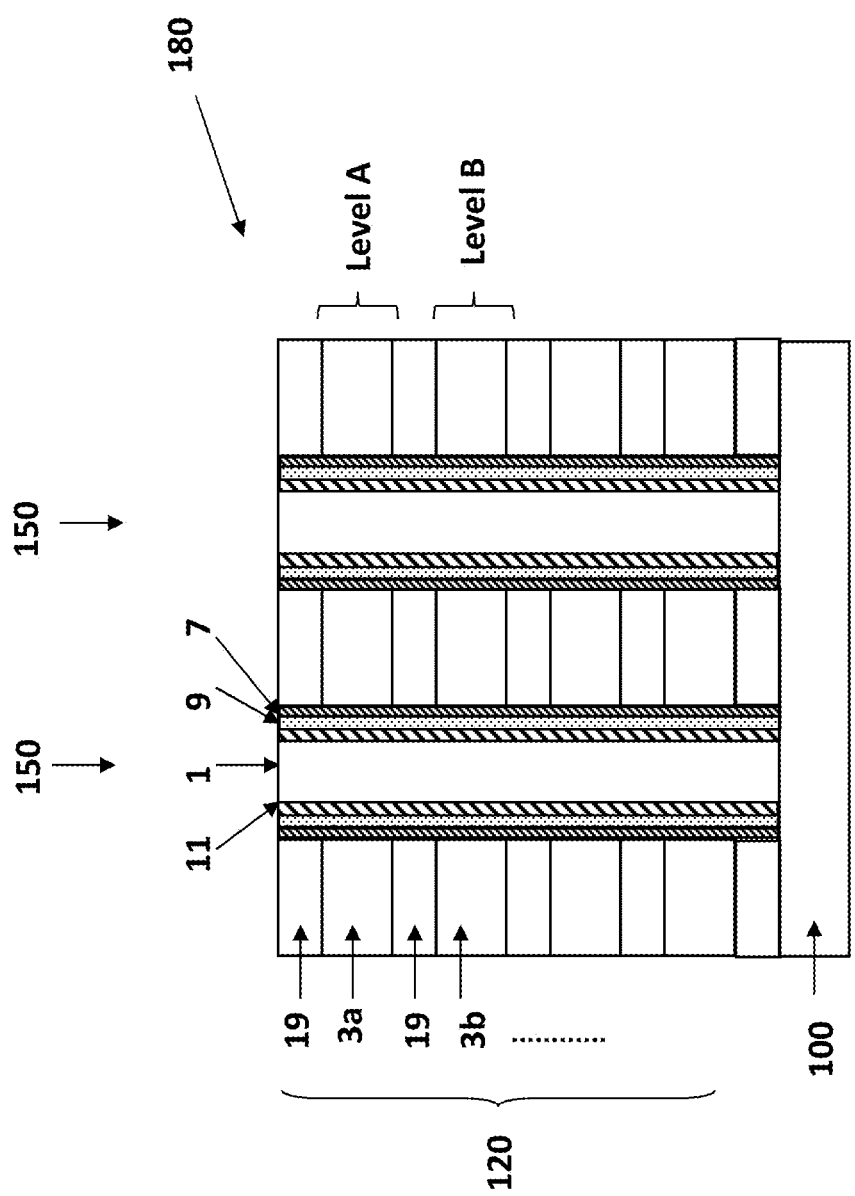
FIG. 3B is a side cross sectional view of another conventional NAND string.

In some embodiments, the monolithic three dimensional NAND string 180 comprises a semiconductor channel 1 having at least one end portion extending substantially perpendicular to a major surface 100a of a substrate 100, as shown in FIGS. 1A, 2A and 3B. "Substantially perpendicular to" (or "substantially parallel to") means within 0-10°. For example, the semiconductor channel 1 may have a pillar shape and the entire pillar-shaped semiconductor channel extends substantially perpendicularly to the major surface of the substrate 100, as shown in FIGS. 1A, 2A and 3B. In these embodiments, the source/drain electrodes of the device can include a lower electrode 102 provided below the semiconductor channel 1 and an upper electrode 202 formed over the semiconductor channel 1, as shown in FIGS. 1A and 2A.

Alternatively, the semiconductor channel 1 may have a U-shaped pipe shape, as shown in FIG. 3A. The two wing portions 1a and 1b of the U-shaped pipe shape semiconductor channel may extend substantially perpendicular to the major surface 100a of the substrate 100, and a connecting portion 1c of the U-shaped pipe shape semiconductor channel 1 connects the two wing portions 1a, 1b extends substantially parallel to the major surface 100a of the substrate 100. In these embodiments, one of the source or drain electrodes $202_1$ contacts the first wing portion of the semiconductor channel from above, and another one of a source or drain electrodes $202_2$ contacts the second wing portion of the semiconductor channel 1 from above. An optional body contact electrode (not shown) may be disposed in the substrate 100 to provide body contact to the connecting portion of the semiconductor channel 1 from below. The NAND string's select or access transistors are not shown in FIGS. 1-3B for clarity.

In some embodiments, the semiconductor channel 1 may be a filled feature, as shown in FIGS. 2A, 2B, 3A and 3B. In some other embodiments, the semiconductor channel 1 may be hollow, for example a hollow cylinder filled with an insulating fill material 2, as shown in FIGS. 1A-1B. In these embodiments, an insulating fill material 2 may be formed to fill the hollow part surrounded by the semiconductor channel 1. The U-shaped pipe shape semiconductor channel 1 shown in FIG. 3A and/or the channel 1 shown in FIG. 3B may alternatively be a hollow cylinder filled with an insulating fill material 2, shown in FIGS. 1A-1B.

The substrate 100 can be any semiconducting substrate known in the art, such as monocrystalline silicon, IV-IV compounds such as silicon-germanium or silicon-germanium-carbon, III-V compounds, II-VI compounds, epitaxial layers over such substrates, or any other semiconducting or non-semiconducting material, such as silicon oxide, glass, plastic, metal or ceramic substrate. The substrate 100 may include integrated circuits fabricated thereon, such as driver circuits for a memory device.

Any suitable semiconductor materials can be used for semiconductor channel 1, for example silicon, germanium, silicon germanium, or other compound semiconductor materials, such as III-V, II-VI, or conductive or semiconductive oxides, etc. The semiconductor material may be amorphous, polycrystalline or single crystal. The semiconductor channel material may be formed by any suitable deposition methods. For example, in one embodiment, the semiconductor channel material is deposited by low pressure chemical vapor deposition (LPCVD). In some other embodiments, the semiconductor channel material may be a recrystallized polycrystalline semiconductor material formed by recrystallizing an initially deposited amorphous semiconductor material.

The insulating fill material 2 may comprise any electrically insulating material, such as silicon oxide, silicon nitride, silicon oxynitride, or other high-k insulating materials.

The monolithic three dimensional NAND string further comprise a plurality of control gate electrodes 3, as shown in FIGS. 1A-1B, 2A-2B, 3A and 3B. The control gate electrodes 3 may comprise a portion having a strip shape extending substantially parallel to the major surface 100a of the substrate 100. The plurality of control gate electrodes 3 comprise at least a first control gate electrode 3a located in a first device level (e.g., device level A) and a second control gate electrode 3b located in a second device level (e.g., device level B) located over the major surface 100a of the substrate 100 and below the device level A. The control gate material may comprise any one or more suitable conductive or semiconductor control gate material known in the art, such as doped polysilicon, tungsten, tungsten nitride, copper, aluminum, tantalum, titanium, cobalt, titanium nitride or alloys thereof. For example, the control gate material in FIGS. 1A, 2A and 3A may comprise a conductive metal or metal alloy, such as tungsten and/or titanium nitride, while the control gate material in FIG. 3B may comprise doped polysilicon.

A blocking dielectric 7 is located adjacent to the control gate(s) 3 and may surround the control gate electrodes 3, as shown in FIGS. 1A, 2A and 3A. Alternatively, a straight blocking dielectric layer 7 may be located only adjacent to an edge (i.e., minor surface) of each control gate electrode 3, as shown in FIG. 3B. The blocking dielectric 7 may comprise a layer having plurality of blocking dielectric segments located in contact with a respective one of the plurality of control gate electrodes 3, for example a first blocking dielectric segment 7a located in device level A and a second blocking dielectric segment 7b located in device level B are in contact with control electrodes 3a and 3b, respectively, as shown in FIG. 3A. Alternatively, the blocking dielectric 7 may be a straight, continuous layer, as shown in FIG. 3B, similar to the device described in U.S. Pat. No. 8,349,681 issued on Jan. 8, 2013 and incorporated herein by reference in its entirety.

The monolithic three dimensional NAND string also comprise a charge storage region 9. The charge storage region 9 may comprise one or more continuous layers which extend the entire length of the memory cell portion of the NAND string, as shown in FIG. 3B. For example, the charge storage region 9 may comprise an insulating charge trapping material, such as a silicon nitride layer.

Alternatively, the charge storage region may comprise a plurality of discrete charge storage regions 9, as shown in FIGS. 1A, 2A and 3A. The plurality of discrete charge storage regions 9 comprise at least a first discrete charge storage region 9a located in the device level A and a second discrete charge storage region 9b located in the device level B, as shown in FIG. 3A. The discrete charge storage regions 9 may comprise a plurality of vertically spaced apart, conductive (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof), or semiconductor (e.g., polysilicon) floating gates. Alternatively, the discrete charge storage regions 9 may comprise an insulating charge trapping material, such as silicon nitride segments.

The tunnel dielectric 11 of the monolithic three dimensional NAND string is located between charge storage region 9 and the semiconductor channel 1.

The blocking dielectric 7 and the tunnel dielectric 11 may be independently selected from any one or more same or different electrically insulating materials, such as silicon oxide, silicon nitride, silicon oxynitride, or other insulating materials. The blocking dielectric 7 and/or the tunnel dielectric 11 may include multiple layers of silicon oxide, silicon nitride and/or silicon oxynitride (e.g., ONO layers) or high-k materials such as aluminum oxide, hafnium oxide or combinations thereof.

FIG. 4 is a top schematic view illustrating a portion of a conventional memory device comprising NAND strings 180. In this device, the front side openings (e.g. memory holes) 81 are circular, thereby resulting in cylindrical pillar shaped NAND strings 180. From the view, the tunnel dielectric 11, charge storage region 9 and blocking dielectric form concentric rings around the channel 1. The control gate electrode 3 in each device level is generally slab shaped. A back side opening 84, such as a trench, electrically separates adjacent NAND strings 180 from each other. As discussed in more detail below, the back side opening 84 may be used in the manufacture of NAND strings 180 according to some embodiments.

Figures 5A, 5B, 5C, 5D, 5E:
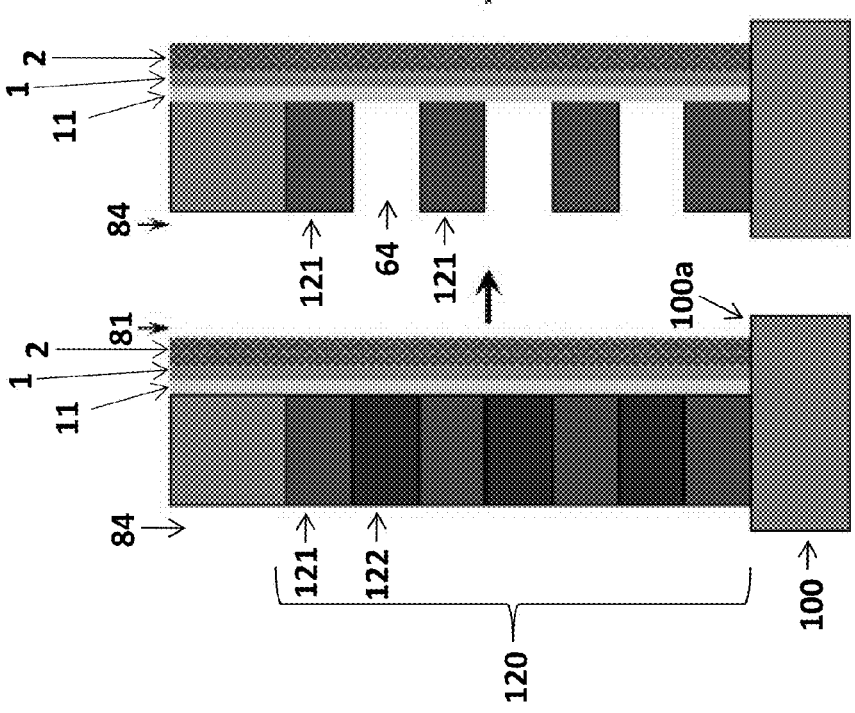
FIGS. 5A-5E illustrate a method of making a NAND string according to an embodiment.

A first embodiment of making a monolithic three dimensional NAND string 180 is illustrated in FIGS. 5A-5E. As illustrated in FIG. 5A, a stack 120 of alternating first material layers 121 and second material layers 122 is provided over a major surface 100a of a substrate 100. The first material layers 121 comprise an insulating material and the second material layers 122 comprise sacrificial layers. In an embodiment, the first material layers 121 comprise silicon oxide and the second material layers 122 comprise polysilicon or amorphous silicon. In an alternative embodiment, the first material layers 121 comprise silicon oxide and the second material layers 122 comprise silicon nitride.

The stack 120 comprises a back side opening 84 (e.g. the slit trench shown in FIG. 4) and a front side opening 81 (e.g. a cylindrical memory hole as shown in FIGS. 1B and 2B). The method includes forming the front side opening 81 followed by forming a tunnel dielectric 11 and a semiconductor channel 1 in the front side opening 81. Optionally, an insulating fill material 2 may be provided to fill any remaining space in the front side opening 81 after forming the semiconductor channel 1. The back side opening 84 is then formed in the stack 120 following formation of the channel 1 and the optional insulating fill material 2.

As illustrated in FIG. 5B, the method includes selectively removing (e.g. selectively etching) the second material layers 122 through the back side opening 84 to form back side recesses 64 between adjacent first material layers 121. Next, as illustrated in FIG. 5C, the method includes forming a metal charge storage layer 99 in the back side opening 84 and in the back side recesses 64. In an embodiment, the metal charge storage layer 99 comprises a tungsten layer. In one embodiment, the tungsten layer is formed by atomic layer deposition with fluorine-free precursors. For example, the tungsten layer is formed by atomic layer deposition with chlorine based precursors, such as $WCl_6$, or with organometallic precursors, such as $W(CH_3)_6$, or MOCVD precursors such as tungsten carbonyl, $WCl_2(Nt\text{-}Bu)_2py_2$, $W(Nt\text{-}Bu)_2Cl\{(Ni\text{---}Pr)_2CNi\text{---}Pr_2\}$, $W(Nt\text{-}Bu)_2Cl\{(Ni\text{---}Pr)_2CNMe_2\}$, $W(Nt\text{-}Bu)_2Cl\{(Ni\text{---}Pr)_2CNEt_2\}$, $W(Nt\text{-}Bu)_2Cl\{(NCy)_2CNEt_2\}$, $W(Nt\text{-}Bu)_2$ $NMe_2\{(Ni\text{---}Pr)_2CNi\text{---}Pr_2\}$, $W(Nt\text{-}Bu)_2(NMe_2)\{(Ni\text{---}Pr)_2CNMe_2\}$, $W(Nt\text{-}Bu)_2(N_3)\{(Ni\text{---}Pr)_2CNi\text{---}Pr_2\}$, $W(Nt\text{-}Bu)_2\{(Ni\text{---}Pr)_2CNMe_2\}$, $[W(Nt\text{-}Bu)_2Cl\{NC(NMe_2)_2\}]_2$, $W(Nt\text{-}Bu)_2(N_3)\{NC(NMe_2)_2\}_2$, $[(W(Nt\text{-}Bu)_2(N_3)(\mu_2\text{-}N_3)py)]_2$ or other precursors. In this embodiment, preferably no barrier layer formation step (discussed in more detail below in regards to FIGS. 7A-7E) is needed between forming the back side recesses 64 and forming the tungsten layer because chlorine and organometallic precursors do not attack the $SiO_2$ tunnel dielectric 11.

Then, as illustrated in FIG. 5D, the method includes a step of forming discrete charge storage regions 9, such as discrete metal floating gates, in the back side recesses 64 by removing the metal charge storage layer 99 from the back side opening 84 and selectively recessing the metal charge storage layer 99 in the back side recesses 64. The removing and/or recessing steps may be performed in one combined or two discrete selective dry and/or wet etching steps. In an embodiment, the discreet charge storage regions 9 comprise tungsten floating gates.

Next, as illustrated in FIG. 5E, the method includes a step of forming a blocking dielectric layer 7 in the back side opening 84 and the back side recesses 64 after forming the discrete charge storage regions 9. Portions of the blocking dielectric 7 in each of the back side recesses 64 have a clam shape with a vertical portion 7c adjacent to the discrete charge storage regions 9 and horizontal portions 7a, 7b adjacent to the first material layers 121. Optionally, the method includes forming a conductive liner layer 4 (e.g. a titanium nitride or tungsten nitride layer) on the blocking dielectric 7 in the back side opening 84 and in the back side recesses 64. Similar to the blocking dielectric 7, portions of the liner layer 4 in each of the back side recesses 64 have a clam shape with a vertical portion 4c adjacent the discrete charge storage regions 9 and horizontal portions 4a, 4b adjacent the first material layers 121.

The method also includes a step of forming a plurality of control gates 3 in the respective clam shell shaped regions of the blocking dielectric 7 or clam shell shaped regions of the optional liner 4 in the back side recesses 64. In an embodiment, the blocking dielectric 7, the liner layer 4 and the control gate layer are removed from the back side opening 84 to form the plurality of control gates 3 in the respective clam shell shaped regions of the blocking dielectric 7 or liner layer 4 in the back side recesses 64.

In an embodiment, the plurality of control gates 3 comprise tungsten control gates, the liner layer 4 comprises a tungsten nitride or titanium nitride layer, the first material layers 121 comprise silicon oxide layers, and the sacrificial layers comprise amorphous silicon, polysilicon or silicon nitride layers. In an embodiment, selectively removing the second material layers 121 to form back side recesses 64 between adjacent first material layers 121 comprises completely removing the second material layers 122 to expose the tunnel dielectric 11 in the back side recesses 64. In this embodiment, the metal charge storage layer 99 contacts the tunnel dielectric 11 in the back side recesses 64. In an embodiment, the front side opening 81 does not have front side recesses between the first material layers 121.

In an embodiment, the substrate comprises a silicon substrate. The NAND string 180 is located in a monolithic, three dimensional array of NAND strings 180 located over the silicon substrate 100. At least one memory cell in the first device level of the three dimensional array of NAND strings 180 is located over another memory cell in the second device level of the three dimensional array of NAND strings 180. The silicon substrate 100 contains an integrated circuit comprising a driver circuit for the memory device located thereon.

FIGS. 6A-6E illustrate a second embodiment of making a monolithic three dimensional NAND string 180. In this embodiment, the NAND string 180 is a hybrid NAND string 180. That is, the NAND string of this embodiment includes both metal discrete charge storage regions 9 and a charge storage dielectric layer 59.

As illustrated in FIG. 6A and similar to the previous embodiment, a stack 120 of alternating first material layers 121 and second material layers 122 is provided over a major surface 100a of a substrate 100. The first material layers 121 comprise an insulating material and the second material layers 122 comprise sacrificial layers.

As in the previous embodiment, the stack 120 comprises a back side opening 84 and a front side opening 81. In contrast to the previous embodiment, the method according to this embodiment includes a step of forming a charge storage dielectric layer 59, such as a silicon nitride layer, in the front side opening 81 before forming the tunnel dielectric 11 and the semiconductor channel 1. Optionally, as in the previous embodiment, an insulating fill material 2 may be provided to fill any remaining space in the front side opening 81 after forming the semiconductor channel 1.

The remaining steps of the method are the same as in the previous embodiment. That is, as illustrated in FIG. 6B, the method includes selectively removing the second material layers 122 through the back side opening 84 to form back side recesses 64 between adjacent first material layers 121. Then, as illustrated in FIG. 6C, the method includes a step of forming a metal charge storage layer 99 in the back side opening 84 and in the back side recesses 64. In an embodiment, selectively removing the second material layers 122 to form back side recesses 64 between adjacent first material layers 121 comprises completely removing the second material layers 122 to expose the charge storage dielectric layer 59 in the back side recesses 64. In this embodiment, the metal charge storage layer 99 contacts the charge storage dielectric layer 59 in the back side recesses 64 to form a hybrid device.

Then, as illustrated in FIG. 6D, the method includes a step of forming discrete charge storage regions 9, such as discrete floating gates, in the back side recesses 64 by removing the metal charge storage layer 99 from the back side opening 84 and selectively recessing the metal charge storage layer 99 in the back side recesses 64.

Next, as illustrated in FIG. 6E, the method includes a step of forming a blocking dielectric layer 7 in the back side opening 84 and the back side recesses 64 after forming the discrete charge storage regions 9. As in the previous embodiment, portions of the blocking dielectric 7 in each of the back side recesses 64 have a clam shape with a vertical portion 7c adjacent the discrete charge storage regions 9 and horizontal portions 7a, 7b adjacent the first material layers 121. Optionally, the method includes forming a liner layer 4 on the blocking dielectric 7 in the back side opening 84 and in the back side recesses 64. Similar to the blocking dielectric 7, portions of the liner layer 4 in each of the back side recesses 64 have a clam shape with a vertical portion 4c adjacent the discrete charge storage regions 9 and horizontal portions 4a, 4b adjacent the first material layers 121.

The method also includes a step of forming a plurality of control gates 3 in the respective clam shell shaped regions of the blocking dielectric 7 or clam shell shaped regions of the optional liner 4 in the back side recesses 64. Preferably, the blocking dielectric 7, the liner layer 4 and the control gate layer are removed from the back side opening 84 to form the plurality of control gates 3 in the respective clam shell shaped regions of the blocking dielectric 7 or liner layer 4 in the back side recesses 64.

A third embodiment of making a monolithic three dimensional NAND string 180 is illustrated in FIGS. 7A-7E. This embodiment is similar to the first embodiment. However, in this embodiment, a barrier layer 16 is formed in the back side recesses 64 prior to forming the control gate layer 99. In another embodiment (discussed in more detail below), a second barrier layer 16d is formed over an exposed back surface of the discrete charge storage regions 9 in the back side recesses 64 after forming the discrete charge storage regions 9.

As illustrated in FIG. 7A, a stack 120 of alternating first material layers 121 and second material layers 122 is provided over a major surface 100a of a substrate 100. As in the previous embodiments, the first material layers 121 comprise an insulating material and the second material layers 122 comprise sacrificial layers. In an embodiment, the first material layers 121 comprise silicon oxide and the second material layers comprise polysilicon or amorphous silicon. In an alternative embodiment, the first material layers 121 comprise silicon oxide and the second material layers comprise silicon nitride.

The stack 120 comprises a back side opening 84 and a front side opening 81. As in the embodiment illustrated in FIGS. 5A-5E, the front side opening 81 includes a tunnel dielectric 11 and a semiconductor channel 1 formed thereon. Optionally, an insulating fill material 2 may be provided to fill any remaining space in the front side opening 81 after forming the semiconductor channel 1. Optionally, the charge storage dielectric layer 59 may also be formed in the opening 81 as described above if a hybrid device is to be formed.

As illustrated in FIG. 7B, the method includes selectively removing the second material layers 122 through the back side opening 84 to form back side recesses 64 between adjacent first material layers 121. Then, in this embodiment, a first barrier layer 6 is formed in the back side opening 84 and in the back side recesses 64. The first barrier layer may comprise a tungsten nitride barrier layer. Portions 16 of the first barrier layer 6 in each of the back side recesses 64 have a clam shape with a vertical portion 16c adjacent to the tunnel dielectric 11 (or the charge storage dielectric layer 59, if present) and horizontal portions 16a, 16b adjacent to the first material layers 121. The metal charge storage layer 99 is then formed on the first barrier layer 6 in the back side opening 84 and in the back side recesses 64. Due to the presence of the barrier layer, the metal charge storage layer 99 may be formed using ALD or CVD with fluorine containing precursors, such as WF$_6$, which typically attacks the thin SiO$_2$ tunnel dielectric 11.

Then, as illustrated in FIG. 7C, the method includes a step of forming discrete charge storage regions 9, such as discrete floating gates, in the back side recesses 64 by removing the metal charge storage layer 99 from the back side opening 84 and selectively recessing the metal charge storage layer 99 in the back side recesses 64. In an embodiment, the first barrier layer 6 is also removed from the back side opening 84 and selectively recessed in the back side recesses 64 in the same or different removal and/or recess step(s) as those for metal charge storage layer 99. After the step of recessing the first barrier layer 6, the first barrier layer 6 has a smaller clam shape with recessed (i.e. shortened) horizontal portions 16a', 16b' adjacent to the front side of the first material layers 121 while the back horizontal sides of the layers 121 in the recesses are exposed. In an embodiment, the discrete charge storage regions comprise tungsten floating gates 9 located in clam shaped first barrier layer 6 portions 16.

Optionally, as illustrated in FIG. 7D, a second barrier layer 16d may be formed over an exposed back surface of the discrete charge storage regions 9 in the back side recesses 64. The second barrier layer may be formed, for example, by nitriding the exposed back surface of the discrete charge storage regions 9 by exposing the regions to a nitrogen containing ambient (e.g. a nitrogen containing plasma or high temperature annealing in a nitrogen containing atmosphere). In an embodiment, the discrete charge storage regions 9 are tungsten floating gates and the second barrier layer 16d is a tungsten nitride. Alternatively, layer 16d may be formed by depositing a barrier layer into the back side opening 84 and the back side recesses 64 followed by removing and recessing the layer from the respective back side opening 84 and back side recesses 64. The second barrier layer 16d may also comprise tungsten nitride. In an embodiment, the discrete charge storage regions 9 comprise tungsten floating gates located between the first 6 and the second 16d tungsten nitride barrier layers.

Next, as illustrated in FIG. 7E, the method includes a step of forming a blocking dielectric layer 7 in the back side opening 84 and the back side recesses 64 after forming the discrete charge storage regions 9. As in the previous embodiments, portions of the blocking dielectric 7 in each of the back side recesses 64 have a clam shape with a vertical portion 7c adjacent the discrete charge storage regions 9 and horizontal portions 7a, 7b adjacent the exposed back side horizontal portions of the first material layers 121. Optionally, as in the previous embodiments, the method includes forming a liner layer 4 on the blocking dielectric 7 in the back side opening 84 and in the back side recesses 64. Similar to the blocking dielectric 7, portions of the liner layer 4 in each of the back side recesses 64 have a clam shape with a vertical portion 4c adjacent the discrete charge storage regions 9 or to the optional second barrier layer 16d and horizontal portions 4a, 4b adjacent the first material layers 121.

The method also includes a step of forming a plurality of control gates 3 in the respective clam shell shaped regions of the blocking dielectric 7 or clam shell shaped regions of the optional liner 4 in the back side recesses 64. Preferably, the blocking dielectric 7, the liner layer 4 and the control gate layer are removed from the back side opening 84.

The second and third embodiments of the invention form NAND strings 180 shown in FIGS. 6E and 7E and memory devices comprising a monolithic, three dimensional array of memory devices. The monolithic three dimensional NAND string includes the semiconductor channel 1, at least one end portion of the semiconductor channel 1 extending substantially perpendicular to a major surface 100a of the substrate 100. The string further also includes a plurality of control gate electrodes 3 extending substantially parallel to the major surface 100 of the substrate 100. The plurality of control gate electrodes 3 comprise at least a first control gate electrode 3a located in a first device level and a second control gate electrode 3b located in a second device level located over the major surface 100a of the substrate 100 and below the first device level. The NAND string includes a blocking dielectric 7 located in contact with the plurality of control gate electrodes 3, a tunnel dielectric 11 in contact with the semiconductor channel 1 and a plurality of vertically spaced apart floating gates 9 located between the blocking dielectric 7 and the tunnel dielectric 11. Each floating gate comprises a tungsten portion located between a first nitride layer and a second nitride layer.

In the second embodiment shown in FIG. 6E, the first nitride layer comprises a continuous silicon nitride charge storage dielectric layer 59 and the NAND string comprises a hybrid NAND string. In the third embodiment shown in FIG. 7E, the first nitride layer comprises a first tungsten nitride barrier layer 6 having clam shaped portions 16 and the second nitride layer comprises a second tungsten nitride barrier layer 16d.

In another embodiment, a three dimensional array of memory devices is located over a silicon substrate 100. The array of memory devices comprises an array of vertically oriented NAND strings 180 described above with respect to the prior embodiments in which at least one memory cell in a first device level of the array is located over another memory cell in a second device level and an integrated circuit comprising a driver circuit for the array of memory devices is located on the silicon substrate.

Although the foregoing refers to particular preferred embodiments, it will be understood that the invention is not so limited. It will occur to those of ordinary skill in the art that various modifications may be made to the disclosed embodiments and that such modifications are intended to be within the scope of the invention. All of the publications, patent applications and patents cited herein are incorporated herein by reference in their entirety.

What is claimed is:

1. A method of making a three dimensional NAND string, comprising:
   providing a stack of alternating first material layers and second material layers over a substrate, wherein the first material layers comprise an insulating material and the second material layers comprise sacrificial layers;
   forming a front side opening in the stack;
   forming a tunnel dielectric in the front side opening;
   forming a semiconductor channel in the front side opening over the tunnel dielectric;
   forming a back side opening in the stack;
   selectively removing the second material layers through the back side opening to form back side recesses between adjacent first material layers;
   forming a metal charge storage layer in the back side opening and in the back side recesses; and
   forming discrete charge storage regions in the back side recesses by removing the metal charge storage layer from the back side opening and selectively recessing the metal charge storage layer in the back side recesses.

2. The method of claim 1, wherein the metal charge storage layer comprises a tungsten layer and the discreet charge storage regions comprise tungsten floating gates.

3. The method of claim 2, wherein the tungsten layer is formed by atomic layer deposition with fluorine-free precursors.

4. The method of claim 3, wherein the tungsten layer is formed by atomic layer deposition with chlorine based precursors or with organometallic precursors, and wherein no barrier layer formation step occurs between forming the back side recesses and forming the tungsten layer.

5. The method of claim 1, further comprising:
forming a blocking dielectric in the back side opening and in the back side recesses after forming the discrete charge storage regions, wherein the blocking dielectric has clam shell shaped regions inside the back side recesses; and
forming a plurality of control gates in the respective clam shell shaped regions of the blocking dielectric in the back side recesses.

6. The method of claim 5, further comprising:
forming a liner layer on the blocking dielectric in the back side opening and in the back side recesses;
forming a control gate layer over the liner layer in the back side opening and in the back side recesses; and
removing the blocking dielectric, the liner layer and the control gate layer from the back side opening to form the plurality of control gates in the respective clam shell shaped regions of the blocking dielectric in the back side recesses.

7. The method of claim 6, wherein the plurality of control gates comprise tungsten control gates, the liner layer comprises a tungsten nitride or titanium nitride layer, the first material layers comprise silicon oxide layers, and the sacrificial layers comprise amorphous silicon, polysilicon or silicon nitride layers.

8. The method of claim 1, wherein selectively removing the second material layers to form back side recesses between adjacent first material layers comprises completely removing the second material layers to expose the tunnel dielectric in the back side recesses, and wherein the metal charge storage layer contacts the tunnel dielectric in the back side recesses.

9. The method of claim 1, further comprising forming a charge storage dielectric layer in the front side opening prior to forming the tunneling dielectric, such that the tunneling dielectric is located over the charge storage dielectric layer.

10. The method of claim 9, wherein selectively removing the second material layers to form back side recesses between adjacent first material layers comprises completely removing the second material layers to expose the charge storage dielectric layer in the back side recesses, and wherein the metal charge storage layer contacts the charge storage dielectric layer in the back side recesses to form a hybrid device.

11. The method of claim 2, further comprising forming a first barrier layer in the back side recesses prior to forming the metal charge storage layer.

12. The method of claim 11, wherein:
the first barrier layer comprises a tungsten nitride barrier layer;
forming the discrete charge storage regions in the back side recesses further comprises removing the first barrier layer from the back side opening and selectively recessing the first barrier layer in the back side recesses; and
the discrete charge storage regions comprise tungsten nitride and tungsten floating gates.

13. The method of claim 12, further comprising forming a second barrier layer over an exposed back surface of the tungsten floating gates in the back side recesses.

14. The method of claim 13, wherein:
the second barrier layer is formed by nitriding the exposed back surface of the tungsten floating gates;
the second barrier layer comprises a tungsten nitride barrier layer; and
the discrete charge storage regions comprise tungsten floating gates located between the first and the second tungsten nitride barrier layers.

15. The method of claim 13, further comprising:
forming a blocking dielectric in the back side opening and in the back side recesses after forming the discrete charge storage regions, wherein the blocking dielectric has clam shell shaped regions inside the back side recesses; and
forming a liner layer on the blocking dielectric in the back side opening and in the back side recesses;
forming a control gate layer over the liner layer in the back side opening and in the back side recesses; and
removing the blocking dielectric, the liner layer and the control gate layer from the back side opening to form a plurality of control gates in the respective clam shell shaped regions of the blocking dielectric in the back side recesses.

16. The method of claim 1, wherein the front side opening does not have front side recesses between the first material layers.

17. The method of claim 1, wherein:
the substrate comprises a silicon substrate;
the NAND string is located in a monolithic, three dimensional array of NAND strings located over the silicon substrate;
at least one memory cell in the first device level of the three dimensional array of NAND strings is located over another memory cell in the second device level of the three dimensional array of NAND strings; and
the silicon substrate contains an integrated circuit comprising a driver circuit for the memory device located thereon.

* * * * *